(12) United States Patent
Berglund et al.

(10) Patent No.: US 10,586,861 B2
(45) Date of Patent: Mar. 10, 2020

(54) SEMICONDUCTOR DEVICE

(71) Applicant: NEXPERIA B.V., Nijmegen (NL)

(72) Inventors: Stefan Berglund, Nijmegen (NL);
Soenke Habenicht, Nijmegen (NL);
Steffen Holland, Nijmegen (NL); Tim Boettcher, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/818,958

(22) Filed: Nov. 21, 2017

(65) Prior Publication Data

US 2018/0145158 A1 May 24, 2018

(30) Foreign Application Priority Data

Nov. 21, 2016 (EP) ..................................... 16199736

(51) Int. Cl.
*H01L 29/00* (2006.01)
*H01L 29/732* (2006.01)
(Continued)

(52) U.S. Cl.
CPC .......... *H01L 29/732* (2013.01); *H01L 27/067* (2013.01); *H01L 27/0658* (2013.01);
(Continued)

(58) Field of Classification Search
None
See application file for complete search history.

(56) References Cited

U.S. PATENT DOCUMENTS 5,067,002 A * 11/1991 Zdebel ................. H01L 21/033
257/592
6,291,873 B1 9/2001 Hidaka
(Continued)

FOREIGN PATENT DOCUMENTS

WO 2011064618 A1 6/2011

OTHER PUBLICATIONS

European Search Report for the corresponding European application EP 16199736, 2 pages, dated May 17, 2017.
(Continued)

*Primary Examiner* — Reema Patel
(74) *Attorney, Agent, or Firm* — Ohlandt, Greeley, Ruggiero & Perle L.L.P.

(57) ABSTRACT

A semiconductor device and a method of making the same is provided. The device includes a semiconductor substrate having a major surface and a back surface. The device also includes a bipolar transistor. The bipolar transistor has a collector region located in the semiconductor substrate; a base region located within the collector region and positioned adjacent the major surface; an emitter region located within the base region and positioned adjacent the major surface; and a collector terminal located on the major surface of the semiconductor substrate. The collector terminal includes: a first electrically conductive part electrically connected to the collector region; an electrically resistive part electrically connected to the first electrically conductive part, and a second electrically conductive part for allowing an external electrical connection to be made the collector terminal. The second conductive part is electrically connected to the first conductive part via the resistive part.

16 Claims, 6 Drawing Sheets

(51) Int. Cl.
| | |
|---|---|
| *H01L 27/06* | (2006.01) |
| *H01L 29/73* | (2006.01) |
| *H01L 29/06* | (2006.01) |
| *H01L 29/08* | (2006.01) |
| *H01L 29/10* | (2006.01) |
| *H01L 29/417* | (2006.01) |
| *H01L 29/423* | (2006.01) |
| *H01L 29/66* | (2006.01) |
| *H01L 49/02* | (2006.01) |

(52) U.S. Cl.
CPC ...... *H01L 29/0692* (2013.01); *H01L 29/0804* (2013.01); *H01L 29/0821* (2013.01); *H01L 29/1004* (2013.01); *H01L 29/41708* (2013.01); *H01L 29/42304* (2013.01); *H01L 29/66272* (2013.01); *H01L 29/7304* (2013.01); *H01L 28/20* (2013.01)

(56) References Cited

U.S. PATENT DOCUMENTS

| | | |
|---|---|---|
| 2001/0013634 A1 | 8/2001 | Davide |
| 2010/0230719 A1 | 9/2010 | Sawahata |
| 2012/0032303 A1 | 2/2012 | Badih et al. |
| 2013/0075746 A1* | 3/2013 | Mallikarjunaswamy .................... H01L 29/735 257/75 |
| 2015/0187760 A1* | 7/2015 | Hornung ............... H01L 29/732 257/370 |
| 2016/0027905 A1 | 1/2016 | Singh et al. |

OTHER PUBLICATIONS

European Written Opinion for the corresponding European application EP 16199736, 6 pages.

* cited by examiner

SEMICONDUCTOR DEVICE

BACKGROUND OF THE DISCLOSURE

1. Field of the Disclosure

The present specification relates to a semiconductor device that includes a semiconductor substrate having a major surface and a back surface, and a bipolar transistor. The present specification also relates to a method of making a semiconductor device that includes a semiconductor substrate having a major surface and a back surface, and a bipolar transistor.

2. Description of the Related Art

Resistor Equipped Transistors (RETs), also known as Digital Transistors are commonly available in the market for discrete bipolar transistors and are provided by numerous vendors of general purpose devices. In such devices, the bipolar transistor is typically diffused vertically into a semiconductor substrate, and the back surface of the substrate is used as the collector terminal. Typically, a first resistor may be provided on the major surface of the substrate (the top surface) connected to the base terminal. Similarly, a second resistor may be provided on the major surface of the substrate and connected between the emitter and the base. This arrangement can help the customer to reduce component cost and pick and place cost. No vertical bipolar RET, in which a resistor is provided for the collector, is available on the market.

Simple small signal amplifiers like common emitter amplifiers or common base amplifiers are standard building blocks in analog circuits. Manufacturers incorporating these devices into their products may buy a standard bipolar transistor and add resistors on the printed circuit board (PCB) to build the required amplifier. Alternatively, they may use a RET of the kind noted above. However, as noted previously, RETs including a resistor provided for the collector are currently not available. Accordingly, when a RET is used and a resistor is required for the collector, such building blocks cannot be realized at reasonable cost.

SUMMARY OF THE DISCLOSURE

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising:
a semiconductor substrate having a major surface and a back surface; and
a bipolar transistor comprising:
a collector region located in the semiconductor substrate;
a base region located within the collector region and positioned adjacent the major surface;
an emitter region located within the base region and positioned adjacent the major surface; and
a collector terminal located on the major surface of the semiconductor substrate, wherein the collector terminal comprises:
a first electrically conductive part electrically connected to the collector region;
an electrically resistive part electrically connected to the first electrically conductive part, and
a second electrically conductive part for allowing an external electrical connection to be made to the collector terminal, wherein the second electrically conductive part is electrically connected to the first electrically conductive part via the electrically resistive part.

According to another aspect of the present disclosure, there is provided a method of making a semiconductor device, the method comprising:
providing a semiconductor substrate having a major surface and a back surface; and
forming a bipolar transistor of the device by:
forming a collector region in the semiconductor substrate;
forming a base region located within the collector region and positioned adjacent the major surface;
forming an emitter region located within the base region and positioned adjacent the major surface; and
forming a collector terminal located on the major surface of the semiconductor substrate by:
depositing a first electrically conductive part electrically connected to the collector region;
depositing an electrically resistive part electrically connected to the first electrically conductive part, and
depositing a second electrically conductive part for allowing an external electrical connection to be made the collector terminal, wherein the second electrically conductive part is electrically connected to the first electrically conductive part via the electrically resistive part.

Accordingly, embodiments of this disclosure can provide a semiconductor device such as a Resistor Equipped Transistor (RET) which for the first time includes a resistor for the collector. The bipolar transistor of the device may be a "vertical" bipolar transistor, in the sense that the base may be located beneath the emitter in the substrate, with the collector being located beneath the base (and emitter).

The collector region may include a first doped region in which the base region is located. The collector region may also include a second doped region located adjacent the back surface of the semiconductor substrate. The second doped region may be more highly doped than the first doped region. In some examples the second doped region may extend beneath the emitter and base regions. The second doped region may enhance the lateral conductance of the collector region for conducting a collector current from an area of the device located under the base region, to the periphery of the device.

The collector region may further comprises a collector contact region positioned adjacent the major surface for electrical connection to the first electrically conductive part of the collector terminal, wherein the collector contact region is more highly doped than the first doped region of the collector. The provision of the collector contact region can lower the contact resistance of the collector terminal.

In some examples, the collector contact region may be formed using the same implantation and diffusion step as that which is used to form the emitter of the device, simplifying the manufacturing process. Accordingly, the collector contact region may have the same dopant polarity and/or the same dopants as the emitter region and/or may have substantially the same doping level as the emitter region.

The layout of the collector contact region may be chosen to lower the resistance in the connection between an active part of the collector region beneath the base region and the first electrically conductive part of the collector terminal on the major surface of the substrate. For instance, when viewed from above the major surface of the substrate, the collector contact region may extend laterally beyond the edges of the first electrically conductive part of the collector terminal for decreasing the contact resistance provided by the collector contact region. In one example, when viewed from above the major surface of the substrate, the collector contact region may be ring-shaped. The emitter region and base region of the bipolar transistor may be located inside the ring. This can allow the collector contact region to be made relatively large, without having to modify the design of the other parts of the transistor (e.g. the base region).

In other examples, when viewed from above the major surface of the substrate, the collector contact region may be meander-shaped, striped or may include a mesh pattern.

The collector region may include a third region extending between the major surface and the second doped region for electrically connecting the second doped region and the first electrically conductive part of the collector terminal. The third region of the collector region may be a doped region of the semiconductor substrate that is more highly doped than the first doped region of the collector region. Alternatively, the third region be include a trench filled with electrically conductive material, such as a metal or alloy.

The resistance of the electrically resistive part of the collector terminal may be larger than the resistance of a part of the first doped region of the collector region that electrically connects the first electrically conductive part of the collector terminal to the second doped region of the collector region. In such cases, it may not be required to include a collector contact region of the kind described herein, thereby simplifying the construction of the device.

In some examples, a dielectric layer may be located on the major surface. The electrically resistive part and the second electrically conductive part of the collector terminal may be electrically isolated from the collector region by the dielectric layer. The first electrically conductive part of the collector terminal may extend through an opening in the dielectric layer to electrically connect to the collector region.

A base terminal and/or an emitter terminal may be located on the major surface of the device. The base terminal and/or the emitter terminal may also include an electrically resistive part. The dielectric layer may also isolate other features from the major surface of the substrate, such as certain parts of the emitter terminal and/or base terminal of the device.

Each electrically resistive part of the device may be made from the same electrically resistive material. This would allow the electrically resistive parts to be deposited and patterned a using the same manufacturing steps.

According to a further aspect of the present disclosure, there is provided an amplifier including an semiconductor device of the kind described above. The amplifier my, for instance, be a common emitter amplifier or a common base amplifier.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION OF THE DISCLOSURE

Embodiments of this disclosure are described in the following with reference to the accompanying drawings.

Figure 1:
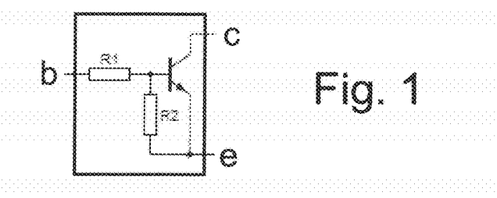
FIG. 1 shows an example of a bipolar transistor incorporating resistors connected to the base and emitter terminals thereof.

FIG. 1 shows an example of a bipolar transistor. As is well known in the art, the bipolar transistor includes a base, a collector and an emitter. The bipolar transistor in FIG. 1 is provided with three terminals, labelled b, c, e for connecting to the base, collector and emitter, respectively. As described above, it is known to provide bipolar transistors with resistors such as the resistors R1 and R2 shown in FIG. 1. The provision of these resistors can allow the construction of devices such as small signal amplifiers. In the present example, the resistor R1 is connected between the base of the transistor and the base terminal b, while the resistor R2 is connected between the base and the emitter of the transistor.

When constructing a device such as a small signal amplifier, a manufacturer may purchase a standard bipolar transistor and add resistors to the amplifier circuit on a printed circuit board (PCB) upon which the bipolar transistor may also be mounted. Alternatively, the manufacturer may choose to use a resistor equipped transistor (RET). An example of a RET is shown in FIGS. 2a and 2b.

Figure 2A:
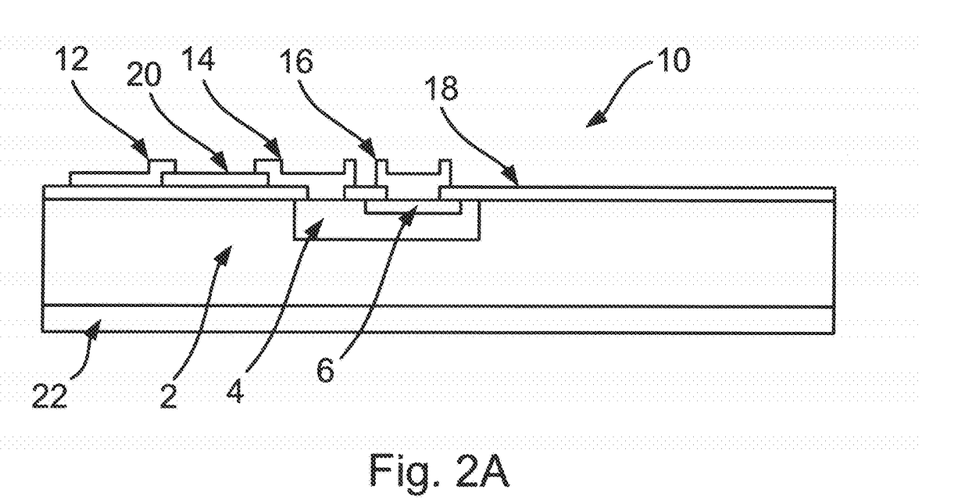
FIG. 2A shows a cross section of a semiconductor device including a bipolar transistor of the kind shown in FIG. 1.
Figure 2B:
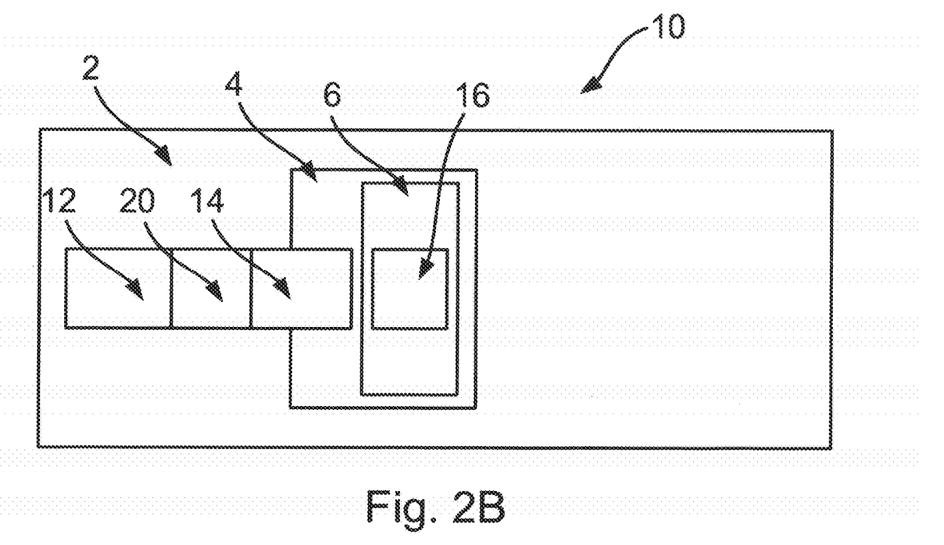
FIG. 2B shows a view of the semiconductor device of FIG. 2A from above a major surface of a substrate of the device.

The semiconductor device 10 comprising a RET shown in FIGS. 2a and 2b includes a semiconductor substrate 2. The substrate 2 may be, for example, a silicon substrate. In this example, the substrate 2 is lightly n-doped (n) and forms the collector region of the bipolar transistor. A back surface of the substrate 2 is also n-doped but is more highly doped (in region 22) than the other parts of the substrate 2, so as to form a collector contact on the back surface of the substrate.

In use, the collector terminal of the device 10 would therefore be located on the back surface of the substrate 2.

The bipolar transistor also includes a base region 4 and an emitter region 6. The base 4 is p-type doped, whereas the emitter 6 is n-doped. Accordingly, in this example, the bipolar transistor is an NPN transistor. It is envisaged that a PNP transistor may instead be provided simply by reversing the plurality of the doped regions above. In this example, the base region 4 is located in the collector region formed by the substrate 2. Note that the base region 4 is also located adjacent the major surface of the substrate 2 (which is opposite the back surface of the substrate). This can allow for convenient connection of a base terminal to the base region 4 itself, at the major surface. Similarly, the emitter region 6 is located inside the base region 4 and again is located adjacent to the major surface of the substrate 2, allowing for convenient connection of an emitter terminal to the emitter region 6 at the major surface.

As can be seen most clearly in FIG. 2a, the device 10 may be provided with an emitter terminal comprising an electrically conductive part 16, which makes contact with the emitter region 6 at the major surface of the substrate 2. Also in this example, the device 10 includes a base terminal. The base terminal includes a first electrically conductive part 14 which connects electrically to the base region 4 at the major surface of the semiconductor substrate 2. In this example, the base terminal is provided with a resistor (e.g. corresponding to the resistor R1 described above in relation to FIG. 1). The resistor of the base terminal in this example is implemented by the provision of an electrically resistive portion 20 which is connected to the electrically conductive part 14 of the base terminal. The base terminal may also include a second electrically conductive part 12, which is connected to the first electrically conductive part 14 via the electrically resistive part 20.

The electrically conductive parts 12, 14, 16 described above may comprise an electrically conductive material such as a metal or alloy and may be deposited and patterned on the surface of the semiconductor substrate using standard deposition techniques. Similarly, the electrically resistive part 20 may be deposited and patterned onto the major surface of the substrate 2 using standard deposition techniques.

As can be seen most clearly in FIG. 2a, the device 10 in this example includes a dielectric layer 18, which covers the major surface of the semiconductor substrate 2. The dielectric layer 18 can serve to isolate features of the device 10 from the major surface of the substrate. For instance, the dielectric layer 18 in this example can isolate the electrically resistive portion 20 and the second electrically conductive part 12 of the base terminal from the underlying collector region formed by the substrate 2. The electrically conductive parts 14, 16 described above may extend through openings provided in the dielectric layer 18 electrically to connect with the underlying features of the device 10 such as the base region 4 and the emitter region 6. The dielectric layer 18 may, for example, comprise an oxide such as silicon oxide.

Since the collector terminal of the device 10 shown in FIGS. 2a and 2b connects to the back surface of the semiconductor substrate 2, a device of the kind shown in FIGS. 2a and 2b cannot be provided with an integrated resistor such as the resistor that is provided for the base terminal (implemented by the electrically resistive portion 20 described above). Therefore, a device of the kind shown in FIGS. 2a and 2b cannot allow a user to construct a small signal amplifier or other similar kind of device without needing to use separate, discrete resistors, mounted on a PCB. Accordingly, this may increase the cost of constructing the small signal amplifier.

Although it is not shown in FIG. 2a or 2b, the device 10 may also be provided with a resistor corresponding to the resistor R2 described above in relation to FIG. 1. The resistor (R2) may be implemented in a similar manner to the way in which the resistor for the base terminal is implemented, namely by providing an electrically resistive portion which extends across the surface of the semiconductor substrate 2. The electrically resistive portion may be connected between the electrically conductive parts 14 and 16.

Figure 3A:
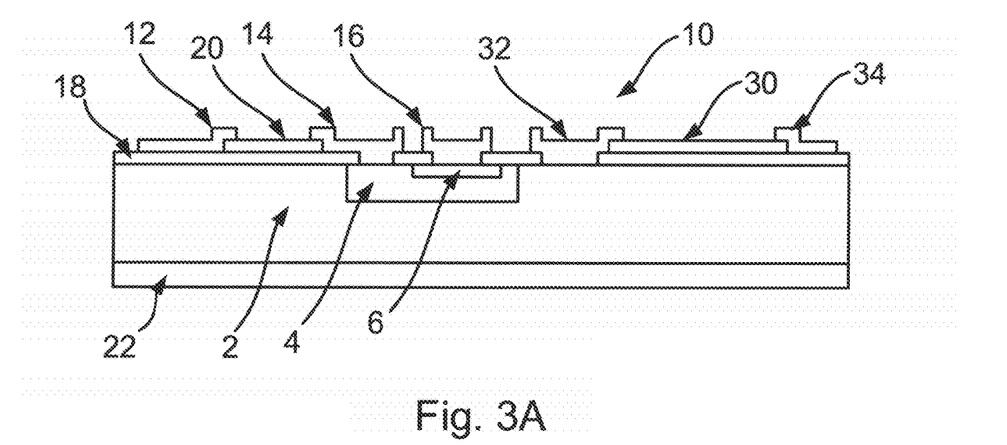
FIG. 3A shows a cross section of a semiconductor device including a bipolar transistor in accordance with an embodiment of this disclosure.
Figure 3B:
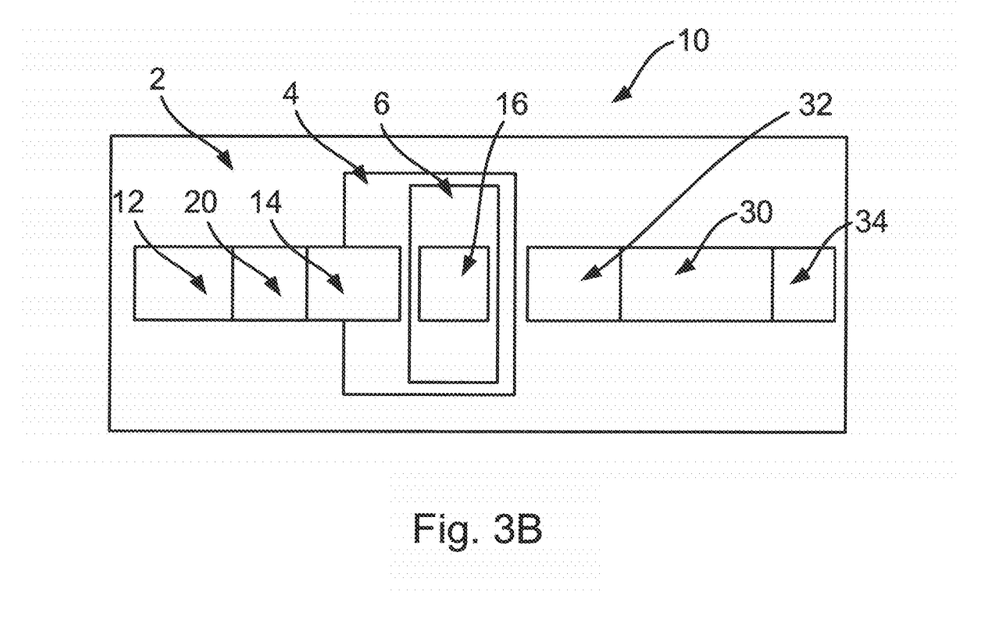
FIG. 3B shows a view of the semiconductor device of FIG. 3A from above a major surface of a substrate of the device.

FIGS. 3a and 3b show an example of a semiconductor device 10 in accordance with an embodiment of this disclosure. The semiconductor device 10 in this example includes a semiconductor substrate. The substrate may, for example, comprise silicon. The semiconductor substrate has a major surface and a back surface.

The device 10 also includes a bipolar transistor, which is formed in the semiconductor substrate. The bipolar transistor in this example includes a collector region 2. The collector region 2 is located in the semiconductor substrate. The collector region may be lightly n-doped (the device in this example comprises an NPN transistor, although it is again envisaged that the device 10 may include a PNP transistor instead). As can be seen in FIG. 3a, the collector region 2 can be formed from a doped region of the bulk of the substrate. The collector region 2 in this example may also include a second, more highly doped region 22, which is located adjacent the back surface of the semiconductor substrate. Unlike the example described above in relation to FIGS. 2a and 2b, the doped region 22 in the present embodiment does not form a collector contact region of the bipolar transistor. Instead, the purpose of the doped region 22 is to enhance the lateral conductance of the collector region 2 for conducting the collector current from the area under the base 4 to the periphery of the device 10.

The bipolar transistor also includes a base region 4. The base region 4 is located within the collector region 2. The base region 4 is positioned adjacent the major surface of the semiconductor substrate. The bipolar transistor further includes an emitter region 6. The emitter region is located within the base region 4. The emitter region 6 is also located adjacent the major surface of the semiconductor substrate. The positioning of the base region 4 and the emitter region 6 adjacent the major surface of the semiconductor substrate can allow for convenient connection of terminals to the base region 4 and emitter region 6 respectively at the major surface.

The base region 4 in this example is p-doped, whereas the collector region 2, the doped region 22 and emitter region 6 are both n-type doped. Typically, the emitter region 6 and the doped region 22 located at the back surface of the substrate are more highly doped than the collector region 2, which, as noted above, may be relatively lightly doped.

Optionally, the bipolar transistor may be provided with a base terminal and/or an emitter terminal. Examples of such base and emitter terminals are shown in FIGS. 3a and 3b. In this example, the emitter and base terminals may be similar to the terminals of the device 10 shown in FIGS. 2a and 2b. Accordingly, the emitter terminal in this example includes a first electrically conductive part 16 which is provided on the major surface of the semiconductor substrate to connect to the emitter region 6. The base terminal in the present example includes a first electrically conductive part 14 which is located on the major surface to electrically connect to the base region 4. The base terminal in this example also includes a resistor, which in this example is implemented using an electrically resistive part 20, which is in electrical communication with the first electrically conductive part 14 of the base terminal. The base terminal may be provided with a second electrically conductive part 12, which is connected to the first electrically conductive part 14 via the electrically resistive part 20. The electrically conductive parts 12 and 16 may be configured to allow external connections to be made to the base and emitter terminals, respectively. For instance, the electrically conductive parts 12, 16 may be connected to, or may themselves comprise, bond pads.

The semiconductor device 10 may be provided with a dielectric layer 18 located on the major surface of the semiconductor substrate. The dielectric layer 18 may, for example, comprise an oxide such as silicon oxide. The dielectric layer 18 may provide physical protection tier the features at the surface of the semiconductor substrate and can also isolate features of the device 10 from the underlying part of the substrate. For instance, in the present example, the second electrically conductive part 12, the electrically resistive part 20 of the base terminal (as well as the electrically resistive part 30 and the second electrically conductive part 34 of the collector terminal to be described below) are electrically isolated from the underlying collector region 2 by the dielectric layer 18.

The bipolar transistor includes a collector terminal. The collector terminal is located on the major surface of the semiconductor substrate. Because the collector terminal is located on the major surface of the semiconductor substrate, the collector terminal can be provided with a resistor that is integrated on the substrate along with the bipolar transistor itself, potentially avoiding the need to provide a separate discrete resistor for the collector terminal in a small signal amplifier circuit incorporating the bipolar transistor.

To implement the resistor of the collector terminal, the collector terminal can include a first electrically conductive part 32, which is electrically connected to the collector region 2. The collector terminal can also include an electrically resistive part 30, which is electrically connected to the first electrically conductive part 32 of the collector terminal. The collector terminal can also include a second electrically conductive part 34, which may be configured to allow an external electrical connection to be made to the collector terminal (for instance, the second electrically conductive part may be a bond pad, or may be connected to a bond pad). The second electrically conductive part 34 is electrically connected to the first electrically conductive part 32 via the electrically resistive part 30, whereby a resistance is added to current flow between the collector region 2 and the second electrically conductive part 34. The first electrically conductive part 32 may extend through an opening in the dielectric layer 18, thereby to connect to the collector 2 at the major surface of the semiconductor substrate.

The electrically conductive parts 32, 34 of the collector terminal (as well as the electrically conductive parts of the emitter terminal and base terminal, where such terminals are included) may, for example, be metallic (e.g. comprising either a metal or a metal alloy). The materials used to construct the electrically resistive part 30 of the collector terminal (as well as, e.g. the electrically resistive part 20) may be chosen according to the required resistivity. Examples of suitable resistor type and materials include n or p doped polysilicon, metal thin film resistors such as WTiN, or a diffused resistor in the main silicon epi 2. The magnitude of the resistance provided by the electrically resistive parts (particularly that of the electrically resistive part 30) may also be tailored by adjusting the lateral length and width of the electrically resistive part, thereby increasing the path length between the first electrically conductive part 32 and second electrically conductive part 34 of the collector terminal. The thickness of the electrically resistive parts, which may take the form of layers, may also be used to adjust their resistance.

In order to further improve the operation of the device 10, steps may be taken to provide a better electrical connection between the first electrically conductive part 32 and the collector 2 (including the highly doped portion of the collector 22).

Figure 4A:
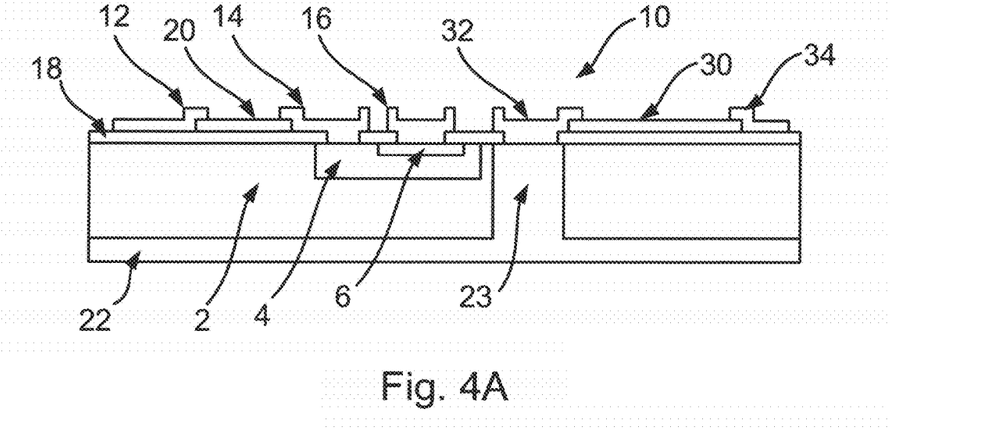
FIG. 4A shows a cross section of a semiconductor device including a bipolar transistor in accordance with an embodiment of this disclosure.
Figure 4B:
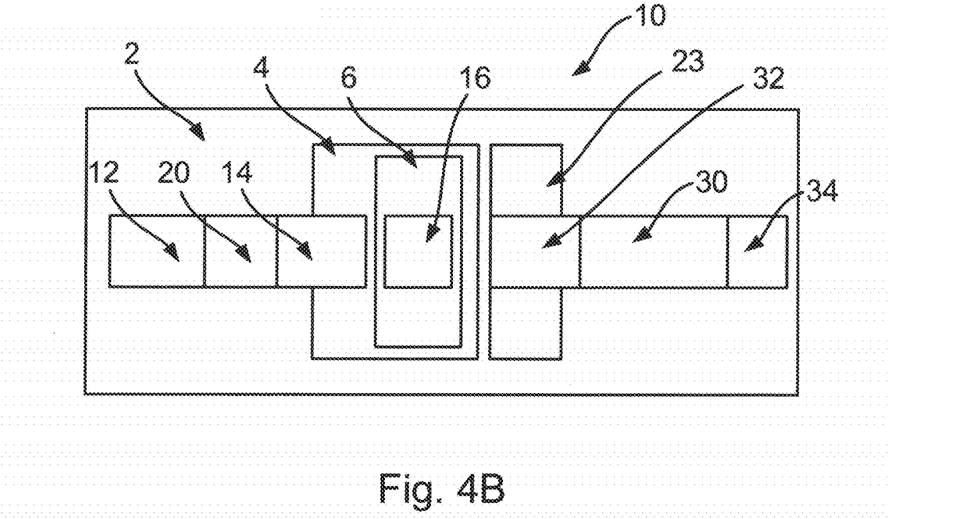
FIG. 4B shows a view of the semiconductor device of FIG. 4A from above a major surface of a substrate of the device.

A first example of this is shown in FIGS. 4a and 4b. The construction of the semiconductor device 10 shown in FIGS. 4a and 4b is similar to that described above in relation to FIGS. 3a and 3b and only the differences will be described here.

As can be seen in FIGS. 4a and 4b, in this embodiment, the semiconductor substrate includes an electrically conductive part 23 which extends between the major surface and the back surface of the substrate. The electrically conductive part 23 may, for example, comprise a more highly doped region of the collector region 2, which extends between the major surface and the back surface. For instance, this more highly doped region may be formed by the implantation and diffusion of ions as is known in the art. In an alternative example, the electrically conductive region 23 may comprise a trench filled with electrically conductive material such as a metal, metal alloy or, for instance, polysilicon that is more highly doped than the collector region 2. At the major surface of the semiconductor substrate, the electrically conductive part 23 makes contact with the first electrically conductive part 32 of the collector terminal. The electrically conductive part 23 connects with the more highly doped region 22 of the collector region 2 in the vicinity of the back surface of the substrate 2. This allows for better electrical communication between the collector terminal and the more highly doped region 22. The resistance between the first electrically conductive part 32 of the collector terminal and the more highly doped region 22 of the collector region 2 may therefore be lowered.

Referring again to FIG. 3a and FIG. 3b, it is envisaged that when the resistance of the electrically resistive part 30 of the collector terminal is larger than the resistance presented by the collector region 2 between the first electrically conductive part 32 and the more highly doped part 22 of the collector region 2, then an electrically conductive part 23 of the kind shown in FIGS. 4a and 4b may be omitted.

Figure 5A:
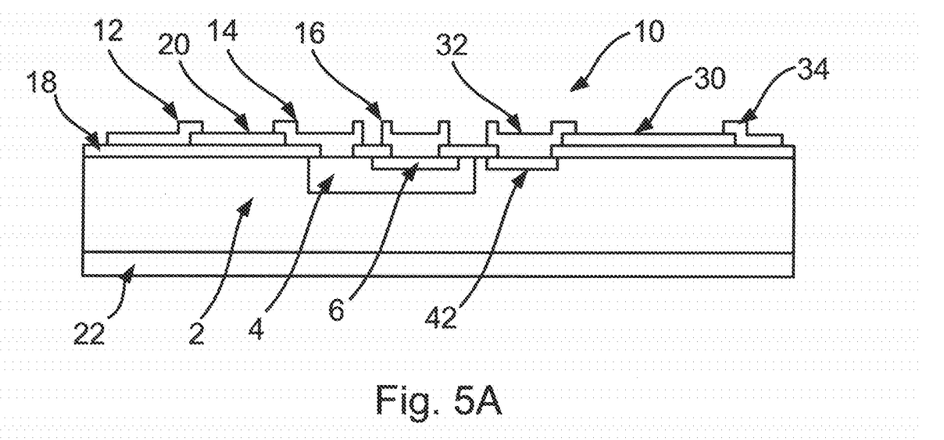
FIG. 5A shows a cross section of a semiconductor device including a bipolar transistor in accordance with an embodiment of this disclosure.
Figure 5B:
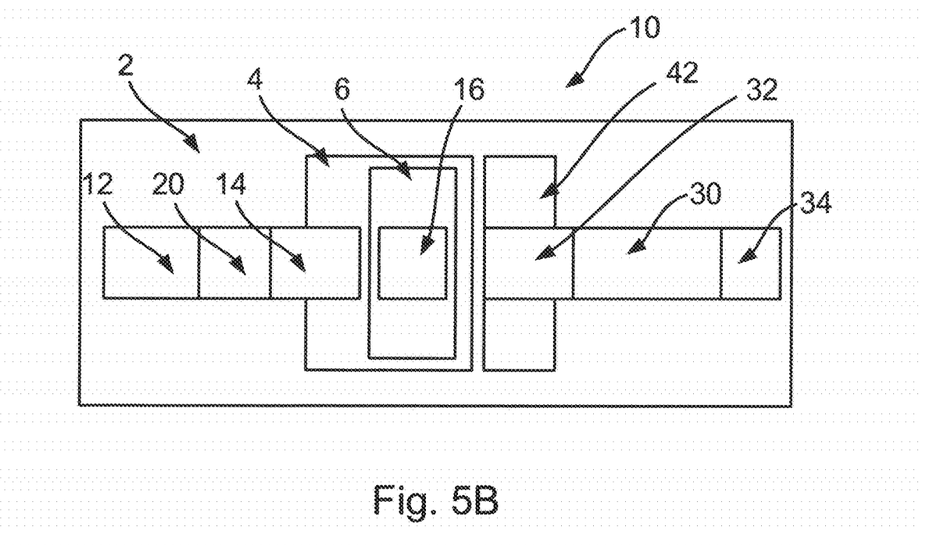
FIG. 5B shows a view of the semiconductor device of FIG. 5A from above a major surface of a substrate of the device.

FIGS. 5a and 5b shown another semiconductor device 10 according to an embodiment of this disclosure. The device shown in FIGS. 5a and 5b is similar to that described above in relation to FIGS. 3a and 3b and only the differences will be described here.

In the example of FIGS. 5a and 5b, the substrate is provided with a collector contact region 42. The collector contact region 42 is positioned adjacent the major surface of the substrate for electrical connection to the first electrically conductive part 32 of the collector terminal. The collector contact region 42 is generally more highly doped than the lightly doped region 2 of the collector 2. This can reduce the contact resistance of the collector terminal. As can be seen in FIG. 5a, the collector contact region may be positioned directly beneath an opening in the dielectric layer 18 so that the first electrically conductive part 32 of the collector terminal, which extends through the opening in the dielectric layer 18 can contact directly with the underlying collector contact region 42.

The collector contact region 42 may be made by forming a more highly doped region in the collector 2 adjacent the major surface of the semiconductor substrate. This may, for example, be done by implanting and diffusing ions into the surface of the substrate using known techniques. In one example, this may be performed as a separate, dedicated implantation and diffusion step. However, it is also envisaged that in some examples the implantation and diffusion process that is used to form the collector contact region 42 may be the same process as that which forms the emitter region 6. In that case, a single implantation step and a single diffusion step could be used to form both the emitter region 6 and the collector contact region 42 thereby simplifying the manufacturing process. Accordingly, it is envisaged that the species and dopant levels used to dope the substrate for forming the emitter region 6 and the collector contact region 42 may be substantially the same. The doping concentration of the emitter region for a typical transistor may be in the range of $1e18$ $cm^{-3}$ to $1e20$ $cm^{-3}$, the base region concentration may be in the range $1e16$ $cm^{-3}$ to $1e18$ $cm^{-3}$. Typically, the collector region 2 (which may comprise an epitaxial layer formed on an underlying part of the substrate) may have a doping of $1e14$ $cm^{-3}$ to $1e16$ $cm^{-3}$. The more highly doped region 22 of the collector region 2 (which may formed by the underlying part of the substrate upon which the epitaxial layer forming the collector region 2 is grown) may have a doping in the range of $1e18$ $cm^{-3}$ to $5e19$ $cm^{-3}$. Again, collector contact region 42 doping may be in the same range as the doping of the emitter region 6.

With reference to FIG. 5*b*, it is envisaged that the collector contact region 42 may extend beyond the edges of the first electrically conductive part 32 of the collector terminal. By increasing the size of the collector contact region 42 in this way, the ability of the collector to collect carriers from the base 4 of the bipolar transistor can be improved, whereby the resistance may be lowered in the connection between the active part of the collector region 2 beneath the base region 4 and the collector contact on the major surface of the substrate.

Figure 6A:
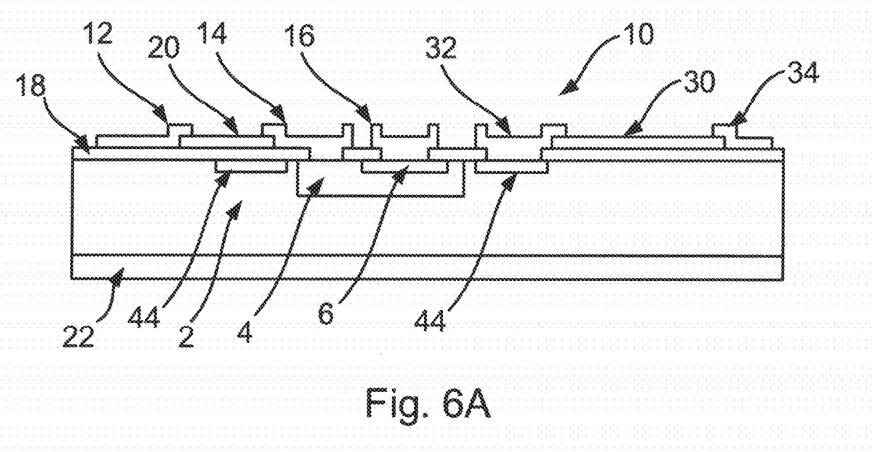
FIG. 6A shows a cross section of a semiconductor device including a bipolar transistor in accordance with an embodiment of this disclosure.
Figure 6B:
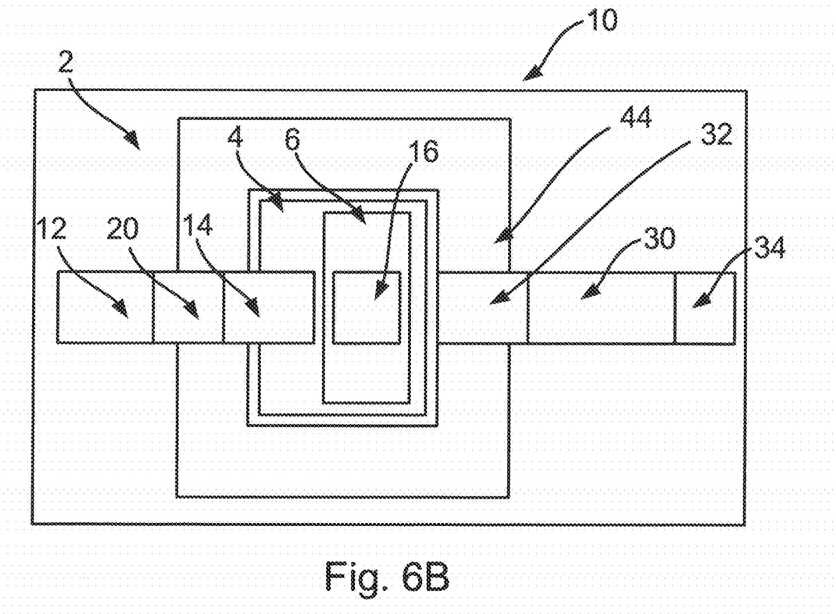
FIG. 6B shows a view of the semiconductor device of FIG. 6A from above a major surface of a substrate of the device.

A further example of the manner in which the collector contact region can be formed is illustrated in the example of FIGS. 6*a* and 6*b*. The semiconductor device 10 shown in FIGS. 6*a* and 6*b* is similar to that described above in relation to FIGS. 5*a* and 5*b* and only the differences will be noted here.

As can be seen in particular in FIG. 6*b*, the collector contact region 44 in this example extends across the major surface of the semiconductor substrate to form a ring shape, when viewed from above the major surface. In this example, the base region 4 and emitter region 6 are both located inside the ring. The emitter region 6 and base region 4 are thus both surrounded by the ring formed by the collector contact region 44 when the device 10 is viewed from above the major surface of the semiconductor substrate. It is envisaged that this configuration can further improve the ability of the collector terminal to collect charge carriers from the base region 4, whereby the resistance may be lowered in the connection between the active part of the collector region 2 beneath the base region 4 and the collector contact on the major surface of the substrate. Further alternative layouts for the collector contact region 44 of the device 10 are envisaged. For instance, the collector contact region could be meander-shaped, striped or may comprise a mesh pattern.

To manufacture a device of the kind described herein, there may first be provided a semiconductor substrate having a major surface and a back surface. The substrate may, for example, comprise a semiconductor wafer (for example silicon) from which a number of like devices may be manufactured prior to singulation of the wafer to produce a plurality of semiconductor substrates, each substrate being of the kind described above in relation to FIGS. 3A, 3B, 4A, 4B, 5A, 5B, 6A and 6B.

In a next step, the bipolar transistor of the device may be made by forming a collector region in the semiconductor substrate, forming a base region located within the collector region and positioned adjacent the major surface of the substrate and forming an emitter region located within the base region and positioned adjacent the major surface of the semiconductor substrate. Note that the collector region, base region and emitter region may all be formed using ion implantation and diffusion steps employing masks to provide the desired layout. The more highly doped region 22 described above in relation to FIGS. 3A, 3B, 4A, 4B, 5A, 5B, 6A and 6B may originate from a starting substrate material, onto which an epitaxial layer may be grown, for forming the collector region 2. Moreover, where a collector contact region is included, this collector contact region may also be formed using ion implantation and diffusion steps with masking, as previously noted.

In a next step, the dielectric layer 18 described above may be deposited onto the major surface of the semiconductor substrate (in some examples, the dielectric layer 18 may be deposited onto thermally grown oxide layers used in the implantation and diffusion steps for forming features such as the emitter region 6 and base region 4). This dielectric layer may then be etched to provide the appropriate openings for the collector terminal (and, where applicable, the base and emitter terminals). Thereafter, an electrically conductive material (e.g. a metal or metal alloy) may be deposited onto the surface of the dielectric layer 18 and then patterned to form the required electrically conductive parts of the collector terminal (and, where applicable, the base terminal and emitter terminal). Similarly, deposition and patterning steps can be used to form the electrically resistive parts 30, 20 of the collector terminal (and, where applicable, the base terminal and emitter terminal).

A semiconductor device 10 of the kind described above can be used to build an amplifier. For instance, the amplifier may be a small signal amplifier such as a common emitter amplifier or common base amplifier.

Examples of such amplifiers are shown in FIGS. 7A, 7B, 8A and 8B.

Figure 7A:
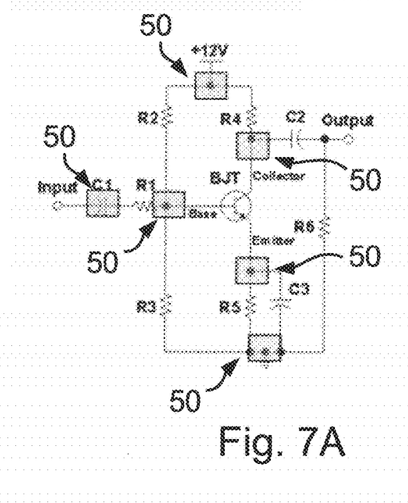
FIGS. 7A and 7B shows an example of a common emitter amplifier incorporating a semiconductor device according to an embodiment of this disclosure.
Figure 7B:
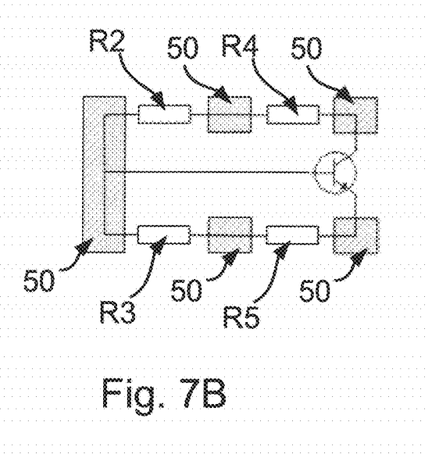

FIGS. 7*a* and 7*b* show an example of a common emitter amplifier incorporating a semiconductor device 10. In FIGS. 7*a* and 7*b*, the boxes labelled 50 correspond to contacts or bond pads of the amplifier. FIGS. 7*a* and 7*b* also illustrate the resistors used in the amplifier. Note that the resistor R4 may form part of the collector terminal of the amplifier as described above in relation to FIGS. 3A, 3B, 4A, 4B, 5A, 5B, 6A and 6B.

Figure 8A:
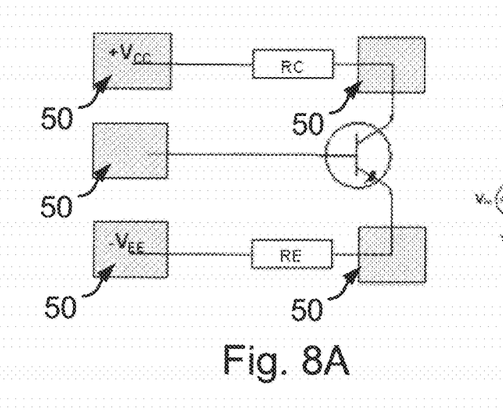
FIGS. 8A and 8B shows an example of a common base amplifier incorporating a semiconductor device according to an embodiment of this disclosure.
Figure 8B:
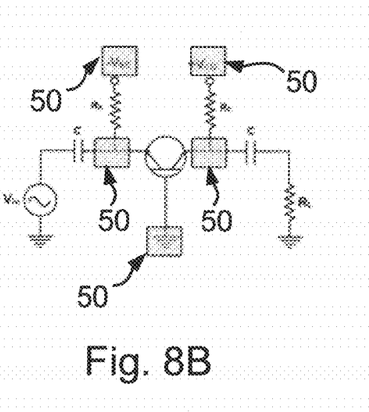

FIGS. 8*a* and 8*b* show an example of a common base amplifier incorporating a semiconductor device of the kind described above in relation to FIGS. 3A, 3B, 4A, 4B, 5A, 5B, 6A and 6B. Again, the boxes labelled 50 correspond to contacts or bond pads of the device. Again, the resistor connected to the collector shown in FIGS. 8*a* and 8*b* ("RC") may be formed from a collector terminal incorporating an electrically resistive part of the kind described above in relation to FIGS. 3A, 3B, 4A, 4B, 5A, 5B, 6A and 6B.

Accordingly, there has been described a semiconductor device and a method of making the same. The device includes a semiconductor substrate having a major surface and a back surface. The device also includes a bipolar transistor. The bipolar transistor comprises a collector region located in the semiconductor substrate; a base region located within the collector region and positioned adjacent the major surface; an emitter region located within the base region and positioned adjacent the major surface; and a collector terminal located on the major surface of the semiconductor substrate. The collector terminal includes: a first electrically conductive part electrically connected to the collector region; an electrically resistive part electrically connected to the first electrically conductive part, and a second electrically conductive part for allowing an external electrical connection to be made the collector terminal. The second conductive part is electrically connected to the first conductive part via the resistive part.

Although particular embodiments of this disclosure have been described, it will be appreciated that many modifications/additions and/or substitutions may be made within the scope of the claims.

The invention claimed is:

1. A semiconductor device comprising:
   a semiconductor substrate having a major surface and a back surface; and
   a bipolar transistor comprising:
      a collector region located in the semiconductor substrate;
      a base region located within a first doped region of the collector region and positioned adjacent the major surface;
      a second doped region located adjacent the back surface of the semiconductor substrate, wherein the second doped region is more highly doped than the first doped region;
      an emitter region located within the base region and positioned adjacent the major surface; and
      a collector terminal located on the major surface of the semiconductor substrate, wherein the collector terminal comprises:
         a first electrically conductive part electrically connected to the collector region;
         an electrically resistive part electrically connected to the first electrically conductive part, and
         a second electrically conductive part for allowing an external electrical connection to be made to the collector terminal, wherein the second electrically conductive part is electrically connected to the first electrically conductive part via the electrically resistive part;
      wherein the collector region comprises a collector contact region positioned adjacent the major surface for electrical connection to the first electrically conductive part of the collector terminal, and wherein the collector contact region is more highly doped than the first doped region.

2. The semiconductor device of claim 1, wherein the collector contact region has at least one of:
   the same dopant polarity,
   the same dopants, and
   substantially the same doping level as the emitter region.

3. The semiconductor device of claim 1, wherein the first electrically conductive part has a plurality of edges;
   wherein the collector contact region has a contact resistance; and
   wherein when viewed from above the major surface of the semiconductor substrate, the collector contact region extends laterally beyond the plurality of edges of the first electrically conductive part of the collector terminal for decreasing the contact resistance provided by the collector contact region.

4. The semiconductor device of claim 3, wherein when viewed from above the major surface of the semiconductor substrate, the collector contact region is ring-shaped, and wherein the emitter region and base region of the bipolar transistor are located inside the collector contact region.

5. The semiconductor device of claim 3, wherein when viewed from above the major surface of the semiconductor substrate, the collector contact region is meander-shaped, striped or comprises a mesh pattern.

6. The semiconductor device of claim 1, wherein the collector region comprises a third region extending between the major surface and the second doped region for electrically connecting the second doped region and the first electrically conductive part of the collector terminal, wherein:
   the third region of the collector region comprises a doped region of the semiconductor substrate that is more highly doped than the first doped region of the collector region; or
   the third region comprises a trench filled with electrically conductive material.

7. The semiconductor device of claim 1, wherein the resistance of the electrically resistive part of the collector terminal is larger than the resistance of a part of the first doped region of the collector region that electrically connects the first electrically conductive part of the collector terminal to the second doped region of the collector region.

8. The semiconductor device of claim 1, comprising a dielectric layer located on the major surface, wherein the electrically resistive part and the second electrically conductive part of the collector terminal are electrically isolated from the collector region by the dielectric layer.

9. The semiconductor device of claim 8, wherein the first electrically conductive part of the collector terminal extends through an opening in the dielectric layer to electrically connect to the collector region.

10. The semiconductor device of claim 1, further comprising a terminal selected from the group consisting of a base terminal, an emitter terminal and any combination thereof located on the major surface of the device, wherein the terminal also includes the electrically resistive part.

11. The semiconductor device of claim 10, wherein each said electrically resistive part of the device comprises the same electrically resistive material.

12. An amplifier comprising the semiconductor device of claim 1.

13. A method of making a semiconductor device, the method comprising:
   providing a semiconductor substrate having a major surface and a back surface; and
   forming a bipolar transistor of the device by:
      forming a collector region in the semiconductor substrate;
      forming a base region located within a first doped region of the collector region and positioned adjacent the major surface;
      forming a second doped region located adjacent the back surface of the semiconductor substrate, wherein the second doped region is more highly doped than the first doped region;
      forming an emitter region located within the base region and positioned adjacent the major surface; and
      forming a collector terminal located on the major surface of the semiconductor substrate by:
         depositing a first electrically conductive part electrically connected to the collector region;

depositing an electrically resistive part electrically connected to the first electrically conductive part, and depositing a second electrically conductive part for allowing an external electrical connection to be made the collector terminal, wherein the second electrically conductive part is electrically connected to the first electrically conductive part via the electrically resistive part, wherein the collector region is formed to comprise a collector contact region positioned adjacent the major surface for electrical connection to the first electrically conductive part of the collector terminal, and wherein the collector contact region is more highly doped than the first doped region.

14. The semiconductor device of claim 2, wherein the first electrically conductive part has a plurality of edges; wherein the collector contact region has a contact resistance; and wherein when viewed from above the major surface of the semiconductor substrate, the collector contact region extends laterally beyond the plurality of edges of the first electrically conductive part of the collector terminal for decreasing the contact resistance provided by the collector contact region.

15. The semiconductor device of claim 2, wherein when viewed from above the major surface of the semiconductor substrate, the collector contact region is ring-shaped, and wherein the emitter region and base region of the bipolar transistor are located inside the collector contact region.

16. The semiconductor device of claim 2, wherein when viewed from above the major surface of the semiconductor substrate, the collector contact region is meander-shaped, striped or comprises a mesh pattern.

* * * * *